United States Patent [11] 3,622,320

[72] Inventor Frank D. Allen, deceased late of Rochester, N.Y. by Mona Armstrong Allen, executrix Rochester, N.Y.

[21] Appl. No. 709,496
[22] Filed Feb. 29, 1968
[45] Patented Nov. 23, 1971
[73] Assignee Eastman Kodak Company Rochester, N.Y.
and a continuation-in-part of 595,998, Nov. 21, 1966, now abandoned. This application Feb. 29, 1968, Ser. No. 709,496

[54] THERMOGRAPHIC PROCESSES AND ELEMENTS UTILIZING PHOTOCROSSLINKABLE POLYESTERS
20 Claims, No Drawings

[52] U.S. Cl. .................... 96/28, 96/87, 96/115
[51] Int. Cl. .................... G03c 11/12
[50] Field of Search .................... 96/115, 28, 35.1, 87

[56] References Cited

UNITED STATES PATENTS

| | | | |
|---|---|---|---|
| 3,060,023 | 10/1962 | Burg et al. | 96/28 |
| 3,353,955 | 11/1967 | Colgrove | 96/28 |
| 3,030,208 | 4/1962 | Schellenberg et al. | 96/35.1 |
| 2,195,362 | 3/1940 | Ellis | 96/115 |
| 3,408,191 | 10/1969 | Jeffers | 96/35.1 |

OTHER REFERENCES

Chemical Abstracts, Vol. 64, 1966, page 9136 d.

*Primary Examiner*—Norman G. Torchin
*Assistant Examiner*—Edward C. Kimlin
*Attorneys*—William H. J. Kline, James R. Frederick and Joshua G. Levitt

ABSTRACT: Photocrosslinkable polyesters prepared with 50 mole percent of at least one diol moiety and 50 mole percent of at least two hydroxy-free dicarboxylic acid moieties, about 5 to 45 mole percent, based on the polyester, of the dicarboxylic acid moieties containing a light-sensitive grouping having the formula $$-CH=CH-\overset{O}{\overset{\|}{C}}- \ ,$$

are useful in a wide variety of photothermographic elements.

THERMOGRAPHIC PROCESSES AND ELEMENTS UTILIZING PHOTOCROSSLINKABLE POLYESTERS

This application is a continuation-in-part of copending application Ser. No. 595,998 filed Nov. 21, 1966 now abandoned.

This invention relates to photothermographic processes and to photothermographic elements containing photosensitive layers for use in such processes.

It is known that certain photosensitive polymeric layers can be photopolymerized by exposure to visible or ultraviolet light to yield a pattern of hardened polymer which can be used in various ways in image reproduction. For example, the unhardened background areas can be removed and the residual hardened image used as a lithographic printing plate, or the relief can be used as a resist for etching the underlying support. Alternatively, the difference in adhesivity and cohesivity between the exposed and unexposed areas of the polymer can be used to permit toning with colored powders, colloid transfer to an adjacent receiving surface, and the like.

These operations are accomplished through such procedures as applying mechanical pressure, treating with solvents, and heating. So-called photothermographic processes, which involve the use of heat to increase the difference in surface adhesion between exposed and unexposed areas of light-sensitive polymeric coatings, are particularly attractive because they obviate the use of solvents or other wet chemical processing steps.

These photothermographic processes have other important advantages. They share the simplicity of conventional thermographic systems and have the additional merits of responding to ultraviolet and visible light and of correctly reproducing continuous tone, as well as line originals.

Many of the prior art light-sensitive photothermographic materials, however, do not provide sharp, high-quality image reproductions. When transfers are made from a matrix to a receiving sheet, the temperature required to effect the transfer is often too high, and temperature control of tackiness too critical for a practical process. Ragged image structures, generally nonuniform transfers, poor reproducibility of multiple transfers and difficulty in separating the matrix from the receiving sheet often result from lack of control of tackiness.

Furthermore, certain of the prior art materials are associated with specific photothermographic processes, particularly processes requiring solvent treatment, and they do not operate effectively in all the various processes of photothermography.

Photographic processes can be improved by the elimination of processing steps and by improving image quality without increasing the number of processing steps. In particular, there is a need for a simplified preparation of positive-to-positive transparencies. Positive-to-positive processes have been sought in recent years but few simple and effective procedures have been found.

There is a need for stable, improved photothermographic compositions which will give crisp, high-fidelity renditions of an original, which will provide uniform multiple transfers without complicated processing, which will operate effectively in the various forms of photothermography, and which can be used in new, improved, photothermographic processes that provide positive-to-positive transparencies and transparencies requiring fewer preparation steps.

It is, therefore, an object of this invention to provide novel photothermographic elements.

It is another object of this invention to provide novel photothermographic processes useful in preparing continuous tone and line copies of graphic originals.

It is another object of this invention to provide a novel class of photocrosslinkable, crystallizable polymers which operate in photothermographic processes at practical temperatures and whose tackiness remains relatively constant over a wide photothermographically operable range of temperature, thus providing easy separation of receiving sheets and production of multiple, uniform transfers without complicated processing.

It is another object of this invention to provide new stable photothermographic materials which are useful in the several various forms of photothermography.

It is another object of this invention to provide novel photothermographic materials which can be employed in combination with pigments and dyes, as well as with color-forming materials, to directly transfer color images in photothermographic processes.

It is another object of this invention to provide novel photothermographic materials useful in the preparation of lithographic plates.

It is another object of this invention to provide novel photothermographic materials useful in the preparation of silk screen and spirit duplicating stencils.

It is also an object of this invention to provide a new two-step photothermographic process for the preparation of projection transparencies.

It is a further object of this invention to provide a novel process for the preparation of projection transparencies by a positive-to-positive system.

It is still a further object of this invention to provide novel photothermographic materials useful in the preparation of printed electrical circuits.

These and other objects of the invention are accomplished with photothermographic elements having coated thereon a thermoplastic, film-forming, light-sensitive composition comprising certain photocrosslinkable polyesters. Such light-sensitive compositions are substantially nontacky at room temperature (20° C.), but have tackifying temperatures (i.e., the temperature at which the composition becomes sensually tacky) of about 50° to 200° C. Typically, the present photocrosslinkable polyester compositions have a crystallinity of about 10 percent to 80 percent as determined by X-ray diffraction, and a glass transition temperature (Tg) of less than about 30° C., glass transition temperature being that temperature at which the compositions in molten state change to a hard glass state. Suitable polyesters are prepared with 50 mole percent of at least one dihydric alcohol or diol moiety and 50 mole percent of at least two hydroxy-free dicarboxylic acid moieties, about 5 to 45 mole percent, based on the polyester, of the dicarboxylic acid moieties containing as an integral portion a light-sensitive grouping having the formula, $$-CH=CH-\overset{\overset{\displaystyle O}{\|}}{C}-$$

On exposure to actinic radiation the present polyesters crosslink to form in the areas of exposure material having a higher tackifying temperature than the original or unexposed polyester. This property facilitates the preparation of images theremographically as described hereinbelow.

A wide variety of diols can be utilized in preparing the subject light-sensitive polyesters. Typical of the suitable diols are those having the formula HO-R-OH wherein R is a divalent organic radical generally having about 2 to 12 carbon atoms, including carbon and hydrogen atoms as well as ether oxygen atoms, e.g., 1) a hydrocarbon radical such as an alkylene radical, a cyclohexane radical, a 1,4-dimethylenecyclohexane radical, a phenylene radical, a 1,4-dialkylenecyclohexane radical, a 2,2-dimethylpropylene radical or the like; 2) an alkylene-0-alkylene-radical; 3) an -alkylene-0-cyclohexane-0-alkylene-radical; and the like. Exemplary diols that can be utilized in preparing the polyesters of the invention include: ethylene glycol, diethylene glycol, 1,3-propane diol, 1,4-butane diol, 1,5-pentane diol, 1,6-hexane diol, 1,7-heptane diol, 1,8-octane diol, 1,9-nonane diol, 1,10-decane diol, 1,12-dodecane diol, neopentyl glycol, 1,4-cyclohexanedimethanol, and 1,4-di-β-hydroxyethoxycyclohexane. Mixtures of such diols can also be used in preparing the present polyesters.

One of the dicarboxylic acids (5 to 45 mole percent of the polyester) utilized in combination with the diols in preparing the present polyesters contains the light-sensitive moiety $$-CH{=}CH-\overset{\overset{O}{\|}}{C}-$$

Particularly useful dicarboxylic acids are those with light-sensitive moieties having the formula $$-R'-CH{=}CH-\overset{\overset{O}{\|}}{C}-$$

wherein R′ is a divalent aryl radical such as phenylene or naphthylene, typical of such dicarboxylic acids being p-phenylene diacrylic acid. Another typical useful dicarboxylic acid having a light-sensitive moiety is fumaric acid.

The dicarboxylic acid containing the light-sensitive moiety is used in combination with at least one additional dicarboxylic acid free of such light-sensitive moiety to substantially modify the properties of the polyester prepared therefrom as described herein. Such modifying dicarboxylic acid can be represented by the formula $$HO\overset{\overset{O}{\|}}{C}-R''-\overset{\overset{O}{\|}}{C}OH$$

wherein R″ is a divalent organic radical generally having about 2 to 12 carbon atoms including such hydrocarbon radicals as, 1) an alkylene radical; 2) a carbocyclic radical such as phenylene and the like. Exemplary dicarboxylic acids that can be utilized in combination with the dicarboxylic acid containing the light-sensitive moiety for preparing the present polyesters include: malonic acid, succinic acid, glutaric acid, adipic acid, pimelic acid, suberic acid, azelaic acid, sebacic acid, dodecanedioic acid, brassylic acid, α,β-diethylsuccinic acid, α-butyl-α-ethyl glutaric acid, terephthalic acid, and isophthalic acid. Mixtures of such dicarboxylic acids can also be used in preparing the present polyesters.

The present polyesters can be prepared by esterifying a diol and a mixture of dicarboxylic acids of the type described above. Typically, the dicarboxylic acid reactants are in the form of esters of lower monohydric alcohols such as methyl, ethyl, n-propyl, n-butyl, isobutyl, isoamyl and the like. The reaction can be suitably effected in the presence of an interesterification catalyst such as a tetraalkyl titanate at an elevated temperature in an organic solvent in accordance with usual practice. If polyols other than glycols are used in preparing the present polyesters, amorphous materials result which do not have the physical properties desired for preparing photothermographic elements. Likewise, if the dicarboxylic acid containing the light-sensitive moiety $$(-CH{=}CH-\overset{\overset{O}{\|}}{C}-)$$

such as p-phenylenediacrylic acid were not used in combination with another dicarboxylic acid as described herein in preparing the present polyesters, a material results that has a higher crystallinity than is desired of the light-sensitive material used in preparing photothermographic elements. Such highly crystalline materials are not desired for use in the transfer of images to receiving sheets in thermographic processes as the receiving sheet and the light-sensitive element are difficult to separate without destruction of the image.

Many film-forming, light-sensitive resins are known, the melting or softening points of which change with light exposure so that they might seem to be applicable to photothermographic systems. In general, however, they suffer seriously from a shortcoming which makes them unsuitable for practical document copying transfer processes, namely, a propensity to harden rapidly after heating to a brittle state which causes difficulty in separating the image-bearing receiving sheet from the matrix. This results in ragged image edges and otherwise poor quality. The present polyesters provide an unexpectedly advantageous solution to this problem. They operate in a reasonable temperature range and remain tacky for a sufficient interval of time to easily produce uniform, high-quality, transferred images. The temperature range for the operation of the present photothermographic processes is about 50°–200° C., and preferably about 80°–150° C.

The polyesters used in the present transfer processes are crystallizable compositions having low-glass transition temperatures (below about 30° C. and more generally below about 20° C.), and slow rates of change of viscosity with changing temperature, at temperatures in the range of interest, e.g., 50°–200° C. These materials in addition to being particularly well suited for reflex exposing processes, are unusually stable throughout extended periods of dark storage under conditions of temperature and humidity common to the tropics as well as the intermediate latitudes.

The polyester materials of the invention are compatible with, and the effectiveness of their operation can be enhanced by, such known photographic addenda as sensitizers, pigmented dyes, color-forming compounds, plasticizers, and the like. For example, the present light-sensitive compositions can be sensitized with such materials as 6-methoxy-β-2-furyl-2-acrylonaphthone, Michler's ketone, Michler's thioketone, quinolizone, 2-chloroanthraquinone, 2,6-bis(p-azidobenzal)-4-methylcyclohexanone, thiazoles, pyrylium salts, thiapyrylium salts and the like sensitizers to obtain highly sensitized photothermographic compositions. Typical suitable sensitizers are described in French Pat. Nos. 1,086,257 and 1,089,290, and U.S. Pat. Nos. 2,610,120, 2,690,966, 2,670,285, 2,670,287, 2,670,286 and 2,732,301.

The present light-sensitive compositions can be coated from solvents in accordance with usual practice. Such compositions are soluble in a number of conventional organic solvents, including methyl ethyl ketone, ethyl acetate, chlorinated hydrocarbon solvents such as ethylene chloride, chloroform, dichloroethane, trichloroethane, and the like, as well as ketones such as acetone and methyl ethyl ketone. In preparing the photothermographic elements of the invention, the light-sensitive compositions described above are coated on suitable photographic supports, including transparent as well as opaque supports, such as cellulose acetate film, polystyrene film, poly(ethylene terephthalate) film, metal sheet, glass, cloth, paper, polyethylene-coated paper, polypropylene-coated paper, or the like.

The resulting photographic element can be exposed imagewise to actinic radiation to cross-link the polyester coated thereon in the exposed areas in proportion to the amount of exposure to provide an imagewise pattern of high and low-melting areas. The element is then heated to a temperature between about 50° and 200° C. to soften or tackify the polymer in the unexposed areas. The softened polymer can then be toned, or transferred to a receiving sheet under pressure and toned, transferred without toning if a pigment, dye or color-forming compound is incorporated in the pigmented layer and/or the receiving sheet, treated in a dye bath, allowed to transparentize in the unexposed areas, or crazed with a crazing solvent to crystallize the unexposed areas.

In those embodiments of this invention where the light-sensitive polyester resin material is transferred to a receiving sheet, the photothermographic elements can incorporate a porous permeable overcoat such as is described in Dulmage et al. U.S. Pat. No. 3,260,612 and in Dulmage et al. U.S. application Ser. No. 614,571 filed Feb. 8, 1967. Such overcoats comprise a porous layer, disposed on top of the light-sensitive polyester resin, which is permeable to the polyester resin material in its transferable state, and which meters and regulates the flow of the polyester resin material from the element to the receiving sheet, thereby permitting a greater number of more uniform copies to be obtained. Suitable porous permeable overcoats can be prepared from such materials as polyvinyl alcohol, gelatin, alumina fibrils, and the like. Their method of preparation and the manner in which they are employed are more fully described in the above-mentioned Dulmage et al. patent and application.

The present polyester photothermographic materials have made possible photothermographic processes which are new to the art, simple, economic, and effective in producing continuous- and discontinuous-tone projection transparencies, as the extent of cross-linking of such polyesters is dependent upon the amount of exposure. The polyesters can be used in processes involving direct toning of the latent, heat-sensitive image with toner particles such as ceramic frits, metal oxides, glass particles, carbon black or other finely divided pigments known in the art. The toner particles can be applied to the image by standard dusting-on techniques such as cascading, or a toner matrix can be employed. The toner matrix can be prepared by dispersing toner particles in a polymeric vehicle. When contacted with the tacky image, toner transfers from the toner matrix to the image. Toning can be obviated by incorporating in the transfer compositions pigments, dyes, or compounds which react with one another upon heating, or react with a compound contained in the receiving sheet, to form a colored compound, dye or element.

In a typical process of the invention, an opaque imagewise exposed photothermographic layer comprising at least one of the present polyesters coated on a transparent support can be heated until the unexposed, uncrosslinked areas transparentize, thus providing a positive-to-negative or negative-to-positive transparency in only two steps, namely, exposing and heating. Opaque coatings useful in such a process can be prepared by coating from ketone solvents, e.g. methyl ethyl ketone.

In another embodiment of the invention, a transparent, photothermographic layer comprising at least one of the present polyesters coated on a transparent support can be exposed, warmed, and sprayed (crazed) with a crazing solvent, which promotes crystallization of the polyester in the unexposed areas, hence rendering the unexposed areas opaque. The result is a novel positive-to-positive process for the preparation of projection transparencies. The crazing solvent can be a nonsolvent for the present polyesters. The purpose of the solvent is, not to dissolve, but to cause the uncrosslinked copolyester to crystallize and be rendered more opaque in the unexposed areas. Ketone solvents, e.g., methyl ethyl ketone and acetates, e.g., methyl acetate and ethyl acetate, are particularly useful for this purpose. Transparent coatings useful in such a process can be prepared by coating from chlorinated hydrocarbon solvents.

When treating the tacky image in a dye bath according to the invention, or when crazing with a crazing solvent, best results are very often obtained by warming the element to melt or soften the unexposed areas, depending upon the particular light-sensitive polyester employed. Presumably, the dye or crazing solvent can more easily penetrate the uncrosslinked polyester when it is first softened by heating.

A wide variety of dyes can be utilized to treat imagewise exposed photographic elements of the invention to form visible images in unexposed areas provided such dyes can be incorporated in a solvent that will not dissolve and remove the uncrosslinked copolyester during treatment of the image. Suitable dye bath solvents include xylene, methyl isoamyl ketone, chloroacetic acid and mixtures of these as well as those solvents commonly used in the art.

The reproduction of images in color by various forms of printing processes and some photographic processes often involves the preparation of a number of separate image components, each one corresponding to a different color in the final reproduction. For instance in color printing by letterpress, lithography or gravure separate image components are prepared corresponding to the separate printing plates which will be used to print different colored inks successively to build up a multicolor reproduction. The preparation of the printing plates is a lengthy and expensive process so that there is a need for a simple method whereby suitability of the separate color image components can be assessed before the final printing plate is made.

The present invention provides a method of making a multicolor reproduction comprising imagewise exposing a light-sensitive matrix having a layer of a polyester resin as described herein having a tackifying point that is raised by light exposure and which contains a dispersed colorant carried by a flexible support, thereafter pressing the exposed polyester resin layer of the matrix in contact with a receiving sheet while heating the matrix to a temperature greater than its tackifying point before exposure but less than its tackifying point in the exposed areas whereby the colored resin transfers from the unexposed areas to the receiving sheet, and thereafter imagewise exposing a further light-sensitive matrix having a layer of the present polyester resin material containing a different colorant and transferring an image therefrom to the same receiving sheet. Such a process of this invention uses a number of light-sensitive matrices each comprising an opaque or transparent flexible support carrying a layer of the present polyester resin material whose softening point is raised by light exposure, and each of which contains a different dispersed colorant. For instance, for full color reproduction it is possible to follow the usual practice of the printing industry and successively expose and transfer images from matrices containing yellow, magenta, cyan and black dyes or pigments. It is, however, possible to omit the black pigment in some cases. The originals used for exposing the matrices can be a set of half-tone color separation positives. The colorants dispersed in the polyester resin layer can be the same as those used in the printing inks on the corresponding printing plates so that the final print represents a very accurate assessment of what would be obtained from the printing plates without the necessity of making, inking and printing from the plate.

This invention also permits silk screen and spirit duplicating stencils of high-quality and good definition to be made from a positive original by a dry photothermographic process. Such a process employs a matrix comprising a porous tissue or cloth, such as are used in the spirit duplicating or silk screen arts, on which is carried a layer of the present polyester resin material whose tackifying point is raised by light exposure. Subsequent to imagewise photoexposure the matrix is contacted, with heat and pressure, with a clean sheet of paper to transfer the unexposed, tacky polyester resin material thereto, leaving a porous image pattern on the matrix which can be employed in spirit duplicating and silk screen reproduction processes.

Resist patterns of an etching solution resistant material on an etchable substrate are frequently used for photomechanical processes such as the preparation of printing plates and so-called "printed" electrical circuits. Various methods of making resist patterns have been proposed and used, including silk screen printing of a resist pattern and formation of a pattern by photohardening imagewise a layer of a light-sensitive resin coated on the substrate. The former method is costly in operation and is only carried out when a large number of identical resist patterns are required. The latter method involves coating a uniform layer of the light-sensitive resin on the substrate and demands considerable skill on the part of the user; subsequent to the light hardening step a solvent wash must be used to remove the unhardened resin with its attendant hazards of fire and toxicity.

The present invention provides a method of forming a resist pattern on a substrate comprising imagewise exposing a light-sensitive matrix by having a layer of the present polyester resin material whose tackifying point is raised by light exposure carried by a flexible support, and thereafter pressing the exposed resin layer of the matrix in contact with an electrically conducting receiving sheet while heating the matrix to a temperature greater than its tackifying point before exposure but less than its tackifying point in the exposed areas whereby the resin transfers from the unexposed areas to the receiving sheet to form a resist image.

In the imagewise transferring of tackified polyester material to receiving sheets in accordance with the invention, the transfer operation is typically carried out by placing the light imagewise exposed polyester resin layer of the matrix in contact with the receiving sheet, passing the sandwich so formed between a pair of heated pressure rollers and then separating the matrix from the receiving sheet which now carries the transferred polyester image. In general these rollers preferably comprise one metal roll such as an aluminum or stainless steel roll, and one resilient roll, such as a rubber roll having a steel core. The heating of the rollers can be by means of internal heating in the metal roll or external heating or a combination of both. The temperature of the rollers is typically held within 5° of the desired transfer temperature. The force with which the rolls are loaded can be widely varied in accordance with usual practice, although loading forces of at least about 10 pounds per linear inch of roll are generally used, with loading forces up to 50 pounds per linear inch being suitable.

Both transmission exposures and reflex exposures can be employed in the photothermographic transfer processes of the invention. In processes using reflex exposures, the photographic element is placed in contact with an original and light is passed from the source through the element to the original. In the image areas of the original, the light is absorbed and in the nonimage areas it is reflected back through the light-sensitive polyester composition, thus further exposing the nonimage areas. Right-reading or laterally reversed images can be obtained depending upon whether the back or the front of the light-sensitive element is in contact with the original.

The following examples are included for a further understanding of the invention.

EXAMPLE 1

A coating dope was prepared by first dissolving eight parts by weight of a polyester prepared from 50 mole percent of 1,5-pentanediol, 18.75 mole percent diethyl p-phenylenediacrylate, and 31.25 mole percent diisoamyl azelate in 73.6 parts of warm ethyl acetate and filtering to remove a small amount of insoluble material. Second, 0.02 part by weight of 4-(p-n-amyloxyphenyl)-2,6-bis(p-ethoxyphenyl)-thiapyrylium perchlorate was dissolved in 18.4 parts by weight of ethylene chloride and the two solutions were combined. The resulting dope was coated at a dry coverage of 0.1 g./ft.$^2$ on a 2.0 mil thick cellulose acetate film support pigmented with titanium dioxide which has an optical reflectance of 80–85 percent. The resulting coated photothermographic element was exposed imagewise by reflex exposure from close proximity to a high intensity tungsten white light source (1,100 watts) while in contact with a typed paper document to be copied. The exposed photothermographic layer of the element was placed in contact with a smooth bond paper receiving sheet and passed through a pair of hot pressure rolls which melted the light-sensitive polyester in the least exposed, relatively uncrosslinked image areas causing transfer of the melted material to the receiving sheet. The transfer rolls were loaded at 25–30 pounds per linear inch and were maintained within the temperature range of 100°–120° C. The receiver sheet was then dusted with powdered toner particles composed of a dispersion of carbon black in polystyrene (Costyreneblak toner, Columbian Carbon Company) and the toned image was fused by heating.

EXAMPLE 2

To 14.2 ml. of a 10 percent dope of a polyester prepared from 50 mole percent 1,5-pentanediol, 18.75 mole percent diethyl p-phenylenediacrylate, and 31.25 mole percent diethyl azelate in ethyl acetate was added 2.0 g. of ferric stearate. This dope was milled with 34 g. of ⅛-inch porcelain balls by rapid agitation for 30 minutes and the dispersion hand-coated on a 4 mil poly(ethylene terephthalate) film support at a wet thickness of 0.002 inch. The element was then overcoated with a 5 percent solution of the prepared polyester in ethyl acetate containing one percent 4-(p-n-amyloxyphenyl)-2,6-bis(p-ethoxyphenyl) thiapyrylium perchlorate based on the weight of the copolyester at a wet thickness of 0.0015 inch. The resulting photothermographic element was exposed imagewise by reflex exposure for 38 seconds to a light source through frosted glass composed of 28 7½-watt incandescent bulbs at a distance of about 1 inch. Transfers were made by placing the coated side of the exposed element in contact with propyl gallate-treated copy paper and passing through pressure rollers maintained at 120° C. A color reaction was effected during transfer and produced a high-density copy of the original document. The propyl gallate-treated copy paper was prepared by dipping a sheet of smooth bond paper into a solution of two parts by weight of propyl gallate in 100 parts by weight of acetone.

EXAMPLE 3

To 21.3 ml. of a 10 percent dope of a polyester prepared from 50 mole percent 1,5-pentanediol, 25 mole percent dimethyl isophthalate and 25 mole percent diethyl-p-phenylene-diacrylate in 1,2-dichloroethane was added 2.0 grams of silver behenate. To another 21.3 ml. portion of this polyester dope was added 0.15 grams of 2-hydroxypropyl isothiuronium trichloroacetate. These two portions were ball milled separately for 3 hours with ⅛ inch ceramic balls. To each portion was added 0.03 grams of 2,6-bis(p-ethoxyphenyl)-4-(p-amyloxyphenyl)thiapyrylium perchlorate as a sensitizer. The two portions were then mixed together and coated on a subbed poly(ethylene terephthalate) support at a wet thickness of 0.002 inch. The element was then imagewise exposed through frosted glass for about 20 seconds to a light source composed of 28 35-watt tungsten iodide lamps at a distance of 1 inch and transfers were made onto a baryta coated paper receiving sheet. By heating the transferred polymer at 200° C. for a few seconds a metallic silver image was developed.

This and the preceding example demonstrate elements in which the photosensitive polymer incorporates, respectively, a color-forming pair of components which react upon heating, and one member of a color-forming component which reacts with the other member of the pair carried in the receiving sheet. The isothiuronium salt employed in this example, as well as isothiuronium salts in general, are members of a class of compounds which cleave upon heating to release basic substances. As illustrated in this example, the base formed on heating can be employed in a color-forming reaction. In this example the base reacts with silver behenate and reduces it to form an image.

EXAMPLE 4

Eight parts of a copolyester prepared from 50 mole percent, 1,5-pentanediol, 18.75 mole percent diethyl p-phenylene-diacrylate, and 31.25 mole percent of diethyl azelate was dissolved in 73.6 parts by weight of warm ethyl acetate and the solution was filtered. To the filtered solution was added 0.04 part by weight of a phthalocyanine pigment (Phthalophone Blue, sold by Harmon Colors) and the mixture was ball-milled with ⅛-inch steel balls with rapid agitation until a uniform dispersion was obtained (about 15 to 20 minutes). A solution of 0.02 part by weight of 4-(p-n-amyloxyphenyl)-2,6-bis(p-ethoxyphenyl) thiapyrylium perchlorate was then added to the resulting dispersion, and the mixture was coated at a dry coverage of 0.1 g./ft.$^2$ on 2.0 mil titanium dioxide pigmented cellulose acetate support having an optical reflectance of 80 to 85 percent. The dry photothermographic element was exposed image-wise by reflex exposure from close proximity to a high-intensity tungsten white light source (1,100 watts) for 12 seconds and then placed with the light-sensitive layer in contact with a lithographic master composed of a paper support having coated thereon a hydrophilic surface layer (Kodak E.V. lithographic master) and passed through hot pressure rollers to transfer the relatively unexposed, uncrosslinked areas of the photothermographic element to the offset plate. The transfer temperature range was 130°–140° C. and the rolls were loaded at about 25–35 pounds per linear inch. The resulting lithographic plate was now ready for offset press operation requiring only a prewetting with fountain solution, which is normal for direct image masters. Press runs with this lithographic plate provided 3,000 copies without evidence of image breakdown. Press latitude was excellent.

EXAMPLE 5

A solution of 2 ml. of ten percent poly(tetramethylene-fumarate/sebacate) (30/70) in methyl ethyl ketone containing 0.2 g. of 6-methoxy-β-2-furyl-2-acrylonaphtone, diluted to 15 ml. with methyl ethyl ketone was coated on tracing paper and on poly(ethylene terephthalate)film support. The resulting coatings were opaque. Each sample was exposed imagewise through a positive for 15 seconds to ultraviolet light in a printer composed of a 4-watt black light at a distance of 1 inch to provide a latent image of cross-linked polymer in the exposed areas. The sample on tracing paper was heated, dusted with a dispersion of carbon black in polystyrene as described in example 1, and heated again to fuse the toner particles providing a good positive reproduction of the original. The second sample was heated on a 150° C. block until the nonexposed areas became transparent, thus providing a negative image on a projection transparency.

EXAMPLE 6

A polyester prepared from 1,5-pentanediol (50 mole percent), diethyl p-phenylenediacrylate (25 mole percent), and dimethyl isophthalate (25 mole percent) was used to prepare a 5 percent by weight solution in dichloroethane. About 0.01 g. of 4-(p-n-amyloxyphenyl)-2,6-bis(p-ethoxyphenyl)thiapyrylium perchlorate was added and the solution was coated on a poly(ethylene terephthalate) film support at a wet thickness of 0.004 inch to give a clear film. The film was made opaque, or blushed, by dipping the film in ethyl acetate and allowing to dry. The coating was exposed through a negative at close proximity to a high-intensity mercury vapor ultraviolet source of 1,200-watts at a speed of 20-feet per minute. The film was developed by warming on a 150° C. block for about 3 seconds. The partially cross-linked areas were clarified in inverse proportion to the amount of cross-linking, which in turn is proportional to the amount of exposure, and a continuous tone projection transparency resulted.

EXAMPLE 7

A light sensitive matrix was prepared by coating a transparent biaxially stretched poly(ethylene black (Lampblack No. 15, Columbian Carbon Co.) in a solution of 0.5 gram of a vinylidene chloride-acrylonitrile copolymer (having a viscosity of approximately 60 c.p.s. when dissolved as a 20 percent solution in acetone) in 18 ml. of methyl ethyl ketone. The dispersion was made by agitating for 15 minutes using ⅛-inch steel balls for milling action. This dispersion was coated on subbed poly(ethylene terephthalate) support at a wet thickness of 0.002 inch. A photosensitive element was prepared by coating on subbed poly(ethylene terephthalate) support at a wet thickness of 0.002 inch a dope containing 3.0 grams of a copolyester made by condensing 50 mole percent pentamethylene glycol, 25 mole percent dimethyl isophthalate and 25 mole percent diethyl p-phenylenediacrylate(having an inherent viscosity of 0.5l in phenol-chlorobenzene) dissolved in 27 grams of dichloroethane and sensitized with 0.06 gram of 2,6-bis(p-ethoxyphenyl)-4-(p-n-amyloxyphenyl)thiapyrylium perchlorate. This element was image-wise exposed to a 1,350 watt linear infrared lamp at a distance of ¼ inch for 16 seconds. The image areas were then transferred to a sheet of paper by passing the photosensitive sheet and paper in contact through pressure rollers heated to 120° C. The transferred image was then placed in contact with the toner matrix and was again passed through the heated rollers. The carbon black was selectively picked off from the toner matrix and it adhered to the tacky image areas of the receiver sheet producing a dense, high-contrast image that was free of background density.

EXAMPLE 8

A toner matrix was prepared as described in example 7 using the following formulation coated at a coverage of 4 grams per square foot.

| | |
|---|---|
| Lampblack No. 15 | 40 grams |
| Polystyrene (Piccolastic A——5, Pennsylvania Industrial Chemical Co., Inc.) | 10 grams |
| Cyclohexane dimethylene adipate (70) azelate (30) copolymer | 10 grams |

this toner matrix was contacted at a temperature of about 50° C. with photothermographic elements prepared, exposed and transferred as described in example 7. In excess of 50 copies free from background transfer were made using a single toner matrix.

EXAMPLE 9

A photothermographic element prepared and exposed to a line negative as described in example 3 was dipped in a dye bath and washed with water. The dye was absorbed by the unexposed image areas to provide a dyed positive reproduction of the original. The dye bath used was a 2 percent solution of 1-hydroxy-4-p- anisidinoanthraquinone in a solvent mixture of 4 parts by volume of benzaldehyde and 96 parts by volume of xylene.

EXAMPLE 10

A 10 percent solution of a polyester prepared from 25 mole percent diethyl p-phenylenediacrylate, 25 mole percent dimethyl isophthalate and 50 mole percent of 1,5 -pentanediol was prepared in dichloroethane. Five ml. of this solution was sensitized with 0.01 g. of 4-(p-n-amyloxyphenyl)-2,6-bis(p-ethoxyphenyl)thiapyrylium perchlorate and coated on a poly(ethylene terephthalate) film support at a wet thickness of 0.004 inch. The element was placed in contact with an original and reflex-exposed to an incandescent light source as described in example 2 for 8 seconds. The exposed layer was placed in contact with a paper receiving sheet, heated at 100° C. under pressure, and separated. A tacky image was transferred to the receiving sheet, and the tacky image was toned with a carbon black dispersion as described in example 1.

EXAMPLE 11

A 10 percent solution of a polyester prepared from 25 mole percent diethyl p-phenylenediacrylate, 25 mole percent diisoamyl azelate, and 50 mole percent of 1,4-di-β-hydroxyethoxy-cyclohexane was prepared in dichloroethane. Five ml. of this solution was sensitized with 0.01 g. of 4-(p-n-amyloxyphenyl)-2,6-bis(p-ethoxyphenyl)thiapyrylium perchlorate. The solution was coated on a poly(ethylene terephthalate)film support at a wet thickness of 0.002 inch and the resulting clear coating was placed in contact with an original and reflex-exposed to an incandescent light source as described in example 2 for 3 seconds. The element was placed in contact with a paper receiving sheet and a tacky image transferred to the receiving sheet by heating to 100° C. and applying pressure. The tacky image was toned with a carbon black dispersion as described in example 1 to provide a good positive reproduction of the original.

EXAMPLE 12

A 10 percent solution of a polyester prepared from 25 mole percent diethyl p-phenylenediacrylate, 25 mole percent diisoamyl azelate, and 50 mole percent 1,6-hexanediol was prepared in dichloroethane. Five ml. of this solution was sensitized with 0.01 g. of 4-(p-n-amyloxyphenyl)-2,6-bis(p-ethoxyphenyl)thiapyrylium perchlorate. The sensitized solution was coated on a poly(ethylene terephthalate) film support at a wet thickness of 0.004 inch. The resulting clear coating was placed in contact with an original and reflex-exposed for 3 seconds with an incandescent light source as described in example 2. The element was heated to about 100° C. to produce a tacky image in the unexposed areas and the tacky image was toned with a carbon black dispersion as described in example 1.

EXAMPLE 13

A 5 percent solution of a polyester prepared from 18.75 mole percent of diethyl p-phenylenediacrylate, 31.25 mole percent diisoamyl azelate, and 50 mole percent 1,5-pentanediol was prepared in dichloroethane. To 5 ml. of the prepared polyester solution was added 0.006 g. of 4-(p-n-amyloxyphenyl)-2,6-bis(p-ethoxyphenyl)thiapyrylium perchlorate, and 0.006 g. of the dye 2-[bis(4-dimethylaminophenyl) methylene] 2H-benzo[b]phenoxazonium perchlorate. The solution was coated on a poly(ethylene terephthalate) film support at a wet thickness of 0.004 inch. The resulting element was exposed through a transparent positive to a high-intensity ultraviolet light source as described in example 6 at a speed of 10 ft./min. The polyester coating of the prepared element was placed in contact with a paper receiving sheet and with heat and pressure a colored image was transferred to the receiving sheet. A second element prepared as above was placed in contact with an original and reflex-exposed for ten seconds to an incandescent light source as described in example 2. The exposed element was placed in contact with a receiving sheet and again a good image was transferred after applying heat and pressure as with the first element.

EXAMPLE 14

This example illustrates the invention using a porous polyvinyl alcohol overcoat of the kind described more particularly in U.S. Pat. No. 3,260,612. A polyester resin condensed from 18.75 mole percent diethyl p-phenylenediacrylate, 31.25 mole percent diethyl azelate, and 50 mole percent 1,5-pentanediol was dissolved to make a 5 percent solution in dichloroethane. To 25 ml. of this solution were added as sensitizers, 0.03 g. of 4-(p-n-amyloxyphenyl)-2,6-bis(4-ethoxyphenyl)thiapyrylium perchlorate and 0.03 g. of 2-[bis(4-dimethylaminophenyl)methylene]-2H-benzo[b]-phenoxazonium perchlorate. The solution was coated on a length of 8-inch wide poly(ethylene terephthalate) film support at a dry coverage of 0.75 g. per square foot. After the coating had thoroughly dried, one-half of the width of the element was overcoated with a solution made as follows: 8.6 g. of a 25 percent aqueous solution of sodium sulfate was stirred into 100 g. of a 5 percent aqueous solution of poly(vinyl alcohol) which contained 0.1 g. of a surfactant (sodium salt of dioctyl ester of sulfosuccinic acid). The solution was placed in a blender with 1.8 g. of powdered zinc oxide and the mixture was thoroughly mixed by the blender. The dispersion was then coated on a portion of the sensitive element at a dry coverage of 0.4 g. per square foot. After the coatings were thoroughly dried, a sample from the element having areas covered by the overcoat and other areas not covered by the overcoat was exposed in contact with a positive transparency by passage behind frosted glass past a 1,200-watt high-pressure mercury lamp at a speed of 10-feet per minute and at a distance of 1 inch. The element was placed with its coated face in contact with a paper receiving sheet and the two were passed together through the nip of steel rolls heated to 70° C. The sheets were separated and an image had transferred to the receiving sheet. Eight transfers were made from the single element by repeating the transfer step. Successive copies showed more uniform image density in areas that had been transferred from the overcoated portions of the element and more copies of legible quality could be transferred from overcoated portions of the element. In areas not overcoated, transfer from the element was more dense in first copies and density rapidly fell off in succeeding copies. Fewer legible copies were obtained.

EXAMPLE 15

A 5 percent solution of a polyester prepared from 37.5 mole percent 1,5-pentanediol, 12.5 mole percent neopentylglycol, 25 mole percent diethyl p-phenylenediacrylate, and 25 mole percent dimethyl isophthalate, was prepared in dichloroethane. To 5 ml. of this solution was added 0.01 g. of 4-(p-n-amyloxyphenyl)-2,6-bis(p-ethoxyphenyl)thiapyrylium perchlorate sensitizer. The solution was coated on a poly(ethylene terephthalate) film support at a wet thickness of 0.004 inch. The resulting transparent coating was exposed through a positive to the ultraviolet light source as described in example 6 at a speed of 20 ft./min. The element was warmed and sprayed with methyl ethyl ketone which crystallized and opacified the unexposed areas of the element providing a good positive-to-positive projection transparency.

EXAMPLE 16

A light-sensitive matrix was prepared by coating a transparent biaxially stretched poly(ethylene terephthalate) film 0.004 inch thick with the following coating composition:

| | | |
|---|---|---|
| Pentamethylene terephthalate/pentamethylene p-phenylene diacrylate | 50/50 copolymer | 10 grams |
| Trichloroethylene | | 66 ml. |
| Dichloroethylene | | 33 ml. |
| 40% by weight solution of chlorinated diphenyl plasticizer | | 12.5 ml. |

The resulting solution was coated on the support at 50 ml. per square meter and the solvent was dried out of the coating by evaporation. A sheet of the above matrix was light exposed with its light sensitive surface in contact with a positive transparency of a printed circuit diagram in a vacuum printing frame. The light source consisted of four 125-watt high-pressure mercury vapor lamps placed 18 inches from the exposing plane. After exposure the matrix was placed with its sensitive surface in contact with the metallic surface of a flexible copper laminate of the type used for the preparation of printed circuits, namely, a copper clad laminate having a 0.003 inch poly(ethylene terephthalate) support carrying 1 oz. per square foot of copper foil. The matrix and laminate were passed through a pair of heated rollers at a speed of 20 inches per minute. The temperature of the rollers was 82° C. and the rollers were loaded at 30 pounds per linear inch. The sheets were separated immediately after emerging from the rollers and it was found that the areas of the matrix coating corresponding to the dark areas of the original transparency had transferred to the copper surface of the laminate. The laminate was placed in a spray etching machine for 2 minutes and etched with 35°Bé ferric chloride solution. All the copper in the unprotected areas of the laminate was removed in this time leaving a useful flexible printed circuit.

EXAMPLE 17

A light sensitive matrix prepared as described in example 16 was exposed to a positive transparency of a graphic image. The exposed surface of the matrix was placed in contact with a bimetal lithographic plate having a copper surface on a mild steel base. The sandwich was heated by pressing it in contact with a hot plate heated to 74° C. The matrix was then peeled off the plate leaving a resist image corresponding to the graphic characters of the original image. The plate was swabbed with a chromic acid etch, and the copper layer was removed in the unprotected areas leaving the steel base. Copies were printed successfully from the lithographic plate so obtained.

EXAMPLE 18

A light sensitive matrix was prepared as described in example 16 but using a coating solution consisting of equal parts of 10 percent by weight solutions in cyclohexanone of respectively a copolymer of equal parts pentamethylene terephthalate and pentamethylene benzene diacrylate and a copolymer of 67.5 parts pentamethylene azelate and 32.5 parts pentamethylene benzene diacrylate. The matrix was exposed as described in example 16 for 2 minutes to a transparency of a printed circuit diagram and thereafter placed with its sensitive side in contact with the metal surface of a flexible copper laminate. After passage through rollers heated to 82° C. a resist image was transferred to the copper. After etching for 3 minutes using 35° Bé ferric chloride an excellent printed circuit was obtained.

3EXAMPLE 19

A matrix was prepared and exposed as described in example 18. The resist pattern was then transferred to a thin sheet of dyed and sealed anodized aluminum foil. The foil was immersed in a dilute solution of caustic soda which etched away the unprotected surface of the aluminum leaving a dye image in the resist covered areas.

EXAMPLE 20

Light sensitive matrices were prepard by coating unsubbed poly(ethylene terephthalate)film support with the following mixture at a spread of about 50 ml./m.².

| | |
|---|---|
| Pentamethylene terephthalate/pentamethylene p-phenylene diacrylate 50/50 copolymer | 10 grams |
| Pigment | 0.5 grams |
| Chlorinated diphenyl plasticizer | 5 grams |
| Trichloroethylene | 66 mls. |
| Dichloromethane | 33 mls. |

The mixture was ball milled for 24 hours and filtered prior to coating. Three separate coatings were prepared using the following pigments:

a. Yellow (Monolite Fast Yellow GTS, Imperial Chemical Industries)
b. Magenta (Rubine Tone 4BS, Imperial Chemical Industries)
c. Cyan (Heliogen Blue LBG, Badische Anilin-& Soda-Fabrik A.G.)

The yellow pigmented matrix was first exposed for 4 minutes with its coated side in contact with a halftone positive transparency corresponding to the yellow component of a multicolored original subject in a vacuum printing frame using four 125 watt high-pressure mercury vapor lamps placed at 18-inches from the exposing frame. The exposed matrix was then passed in contact with a receiving sheet, a sheet of baryta coated paper, through a pair of heated rollers at 200° F., the speed of the rollers being 60 inch/min. The matrix and the receiving sheet were separated immediately on emerging from the machine. The receiving sheet carrying the yellow transferred image was then exposed to light to harden the transferred image, and was used for successively receiving superposed magenta and cyan pigmented transfer images in register corresponding to their respective color components of the colored original being reproduced by the same technique as described for the yellow transfer images. Also, a four-color reproduction can be prepared with a halftone positive transparency corresponding to the black component of the colored original being reproduced and a black pigmented matrix and superposing the black image on the receiving sheet. A suitable black pigment is carbon black (Monolite Fast Black BS, Imperial Chemical Industries), at a concentration of about 2 grams in the above coating formulation.

EXAMPLE 21

A photothermographic element was prepared by coating an unsubbed transparent poly(ethylene terephthalate) film support 0.003 inch thick, with 70 ml./m.² of the following mixture, which had been pebble-milled for 24 hours prior to coating:

| | |
|---|---|
| Poly(pentamethylene azelate/pentamethylene benzenediacrylate) 62.5/37.5 mole percent | 10 g. |
| Cyclohexanone | 100 ml. |
| Pigment | as below |

Four separate photothermographic elements were prepared using the following pigments:

| | |
|---|---|
| a. Magenta (irgalite Brilliant Red TCR, Geigy Co. Ltd.) | 1.0 g. |
| Magenta (Irgalite Crimson 4BC, Geigy Co. Ltd.) | 0.4 g. |
| b. Yellow (Monolite Yellow GTS, Imperial Chemical Industries) | 0.5 g. |
| c. Cyan (Graphtol Blue 2GLS, Sandoz Products Ltd.) | 0.6 g. |
| d. Black (Graphtol Black BLN, Sandoz Products Ltd.) | 0.6 g. |

The prepared elements were exposed "emulsion to emulsion" for 4 minutes to the corresponding halftone separation negatives in a vacuum printing frame using four 125-watt high-pressure mercury vapor lamps placed 18 inches from the frame. Each exposed material was then "developed" by being passed several times, each time in contact with a fresh cleanout sheet of offset cartridge paper, through a set of heated rollers at a temperature of about 90° C. until the material had been substantially freed from unexposed areas. The sandwich was separated within about 30 seconds of emerging from the rollers and the cleanout sheets were discarded. Finally the four sheets of developed material were superimposed against a sheet of white paper to form a four-color proof.

EXAMPLE 22

A photothermographic element was prepared by coating an unsubbed transparent poly(ethylene terephthalate) film support with 70 ml./m.² of the following mixture, which had been ball-milled for 24 hours prior to coating:

| | |
|---|---|
| Poly(pentamethylene azelate/pentamethylene benzenediacrylate) 67.5/32.5 mole percent | 10 g. |
| Cyclohexanone | 100 ml. |
| Pigment | as below |

Four separate photothermographic elements were prepared using the following pigments:

| | |
|---|---|
| a. Magenta (Fastel Pink B Supra, Imperial Chemical Industries) | 1.0 g. |
| b. Yellow (Monolite Yellow GTS, Imperial chemical Industries) | 0.6 g. |
| c. Cyan (Monastral Fast Blue GS, Imperial Chemical Industries) | 0.6 g. |
| d. Black (Monolite Fast Black BS, Imperial Chemical Industries) | 2.0 g. |

The prepared elements were exposed through their bases to the appropriate continuous-tone separation positives in a vacuum printing frame using four 125-watt high-pressure mercury vapor lamps placed 18 inches from the frame. By exposing through the base, the pigmented polyester composition cross-links or hardens progressively from the base upwards. The exposures used were (*a*) 4 minutes, (*b*) 15 minutes, (*c*) 25 minutes, (*d*) 15 minutes. The exposed material (*a*) was then passed in contact with a sheet of baryta coated paper through a set of heated rollers at about 90° C. The two sheets were separated within about 30 seconds of emerging from the rollers, and the paper receiver now bearing a transferred image was exposed to the U.V. lights for 30 seconds to harden the transferred image sufficiently to prevent "back transfer." The transfer and intermediate exposure procedures were then repeated for each of the remaining three sheets in the order (*b*), (*c*) and finally (*d*). A mechanical register means was used to achieve register of the successive transfers.

EXAMPLE 23

The following composition, which had been ball-milled for 24 hours, was coated on untreated polyethylene-coated paper base at a coverage of 100 ml./m.².

| | |
|---|---|
| Poly(pentamethylene azelate/pentamethylene benzenediacrylate), 62.5/37.5, (acetone extracted, intrinsic viscosity 0.56) | 10 g. |
| Cyclohexanone | 100 ml. |
| Cyan pigment (Graphtol Blue 2 GLS, Sandoz Products Ltd.) | 1 g. |

A sheet of this material was then passed together with a stencil base sheet formed of long fibers ("Yoshino" tissue) through a set of heated rollers at a temperature setting of approximately 85° C. The sandwich was left for at least 1 minute after emerging from the machine, and was then separated, when the entire layer of composition transferred to the Yoshino tissue. This sensitized tissue was exposed for 4 minutes behind a positive transparency in a vacuum printing frame using four 125-watt high-pressure mercury vapor lamps placed 18 inches from the frame. The exposed tissue was developed by being passed, between two sheets of paper, through the hot rollers, and by separating the sheets of paper and tissue within 10 seconds of emerging from the machine. The unexposed areas of the layer transferred to the sheets of paper. The resulting stencil was then attached to a spirit duplicating machine, and copies of excellent legibility were obtained.

Nitrogen is continued. After 6 hours, the alcohol has stopped coming off. The condenser is removed, and the nitrogen is stopped. An agitator is inserted and vacuum is applied slowly through the side arm by a water aspirator. Forty-five minutes later the vacuum is switched to mechanical pump with dry ice traps. After 110 minutes, the inherent viscosity builds to 0.52. The vacuum is released, the stirrer is removed, and the flask is allowed to cool overnight. The polymer is obtained by breaking the flask. Yield is 1,000 grams. This polymer is given an extraction as follows:

10 parts by weight polymer (cut up)
75 parts by weight acetone
25 parts by weight ethyl alcohol This mixture is soaked and stirred until all lumps are gone. The polymer is recovered by filtration and then dried. Yield is approximately 70 percent of original polymer and the inherent viscosity has been raised approximately by 0.10 to 0.20. Similarly, other polyesters of the invention were prepared utilizing the dihydric alcohol and polycarboxylic acid moieties in the molar ratios set forth in the following table. The table also includes the glass transition temperature (Tg) in centigrade degrees for each of the prepared polyesters.

TABLE

| Diol | Percent diol | Percent diethyl-p-phenylene diacrylate | Acid | Percent acid | Tg | η |
|---|---|---|---|---|---|---|
| 1,5-pentanediol | 50 | 12.5 | Azelaic | 37.5 | <−50 | .49 |
| Do | 50 | 25 | Adipic | 25 | −6.5 | ----- |
| Do | 50 | 25 | Adipic<br>Azelaic | 12.5<br>12.5 | −10.5 | ----- |
| Do | 50 | 25 | Isophthalic | 25 | +21.5 | .52 |
| Do | 50 | 10 | do | 40 | 12 | ----- |
| 1,9-nonanediol | 50 | 25 | Azelaic | 25 | 24.7 | .81 |
| Diethylene glycol | 50 | 25 | Sebacic | 25 | −2 | .50 |
| 1,5-pentanediol<br>1,4-di-β-hydroxy-ethoxycyclohexane | 25<br>25 | 37.5 | Azelaic | 12.5 | +17.5 | .46 |
| 1,5-pentanediol<br>Neopentylglycol | 37.5<br>12.5 | 25 | Isophthalic | 25 | +28 | ----- |
| 1,5-pentanediol<br>Neopentylglycol | 37.5<br>12.5 | 10 | do | 40 | +20 | ----- |
| 1,4-di-β-hydroxyethoxycyclohexane | 50 | 25 | Azelaic | 25 | −3 | .47 |
| 1,6-hexanediol | 50 | 25 | do | 25 | −12 | .59 |
| 1,4-cyclohexanedimethanol | 50 | 25 | do | 25 | +11.5 | .39 |
| 1,4-butanediol | 50 | 7.5 | Adipic | 42.5 | −46.5 | .55 |
| Do | 50 | 15 | do | 35 | −37 | .54 |
| Do | 50 | 7.5 | Succinic | 42.5 | −22 | .61 |
| Do | 50 | 15 | do | 35 | −19 | .43 |
| Do | 50 | 20 | do | 30 | −9 | .54 |
| Do | 50 | 10 | Succinic<br>Azelaic | 35<br>5 | −28.5 | .53 |
| Do | 50 | 10 | Succinic<br>Azelaic | 25<br>15 | −37.5 | .42 |
| 1,5-pentanediol | 50 | 25 | Azelaic | 25 | −7.5 | .41 |
| Do | 50 | 25 | do | 25 | −20 | .51 |
| Do | 50 | 20 | do | 30 | −37.5 | .60 |
| Do | 50 | 18.75 | do | 31.25 | −41.5 | .24 |
| Do | 50 | 18.75 | do | 31.25 | −37 | .40 |
| Do | 50 | 17.5 | do | 32.5 | −31.5 | .49 |

EXAMPLE 24

Example 23 was repeated except that a nylon cloth (St. Martin's Bolting Cloth 25N sold by Henry Simon Ltd.) was used in place of Yoshino tissue. The stencil thus obtained was placed on a silk screen printing machine and used to make copies of excellent definition.

EXAMPLE 25

Preparation of Polyesters of the Invention

The preparation is carried out under yellow light. In two-liter polymer flask are placed:

412 g. (1.5 moles) diethyl-p-benzenediacrylate
756 g. (2.5 moles) diisobutyl azelate
916 g. (8.8 moles) 1,5-pentanediol The flask is then immersed to the neck in an oil bath at 235° C. and nitrogen bubbled slowly through the reactants. When the reactants have all dissolved, about 10 minutes, 12 drops of tetraisopropyl titanate are added, and an air condenser is placed on top of the flask with the side arm stoppered.

The above table illustrates typical linear polyesters suitably employed in examples 1 to 25 above. The inherent viscosities (η) referred to were determined at 20° C. by dissolving a 0.25 g. sample of the polyester in 100 cc. of a solvent mixture composed of 50/50 by volume of phenol/chlorobenzene. Typically the subject polyesters have inherent viscosities of about 0.1 to 0.9 and more generally about 0.4 to 0.8. Also, the prepared polyesters had partial crystallinity, all having a crystallinity of 10–80 percent as determined by X-ray diffraction.

The present invention thus provides novel photographic elements and processes utilizing such photographic elements. The light-sensitive compositions of the photographic elements of the invention comprise predominantly the copolyester materials described hereinabove. Such compositions typically have sensitivity in the 300 to 600 mμ range, and thus, have more utility as image recording media than many materials used in thermographic processes that are not sensitive in such areas of the spectrum. Also, the subject polyesters become sensually tacky at temperatures that are practical for use in thermographic image transfer systems (i.e. about 50°–200°

C.), and have relatively slow rates of change of viscosity with changing temperature. Thus, photographic elements having coated thereon such polyesters have particular utility in photothermographic transfer processes wherein, after an imagewise exposure which raises the tackifying temperature of the exposed areas due to cross-linking of the polyester, the light-sensitive layer is heated to selectively render the unexposed areas thereof tacky, and the resulting tackified unexposed areas are transferred to a receiving sheet. Photographic elements having coated thereon the described polyesters also lend themselves to numerous other processes as described herein.

Although the invention has been described in considerable detail with reference to certain preferred embodiments thereof, it will be understood that variations and modifications can be effected without departing from the spirit and scope of the invention as described hereinabove and as defined in the appended claims.

I claim:

1. A photothermographic process which comprises imagewise exposing to actinic radiation a layer of a light-sensitive polyester composition on a photographic support and raising the tackifying temperature of exposed areas, heating the said exposed layer to selectively render unexposed areas tacky, and thereafter transferring the said tackified unexposed areas to a second support; said light-sensitive polyester composition comprising a photocrosslinkable polyester and having a tackifying temperature of about 50° C. to 200° C., a glass transition temperature of less than about 30° C., and a crystallinity of about 10 to 80 percent as determined by X-ray diffraction, said polyester containing as recurring units:

a. 50 mole percent of at least one dihydric alcohol moiety, and
b. 50 mole percent of at least two dicarboxylic acid moieties esterified with said dihydric alcohol moiety, about 5 to 45 mole percent of said dicarboxylic acid moieties containing as an integral portion a $$-CH=CH-\overset{\overset{O}{\|}}{C}-$$

grouping.

2. The process of claim 1 wherein the light-sensitive composition contains a colorant and a colored image is transferred to the second support.

3. The process of claim 1 wherein the light-sensitive composition is sensitized with a thiapyrylium salt.

4. The process of claim 1 wherein the dicarboxylic acid moiety containing the $$-CH=CH-\overset{\overset{O}{\|}}{C}-$$

grouping is derived from a dicarboxylic acid selected from the group consisting of p-phenylene diacrylic acid and fumaric acid.

5. The process of claim 1 wherein the dihydric alcohol moiety is derived from an alcohol having the formula HO-R-OH wherein R is a divalent organic radical having 2 to 12 carbon atoms selected from the group consisting of hydrocarbon radicals, -alkylene-O-alkylene- radicals and -alkylene-O-cyclohexane-O-alkylene- radicals.

6. The process of claim 1 wherein the dihydric alcohol moiety is derived from an alcohol having the formula HO-R-OH wherein R is an alkylene radical having 2 to 12 carbon atoms, the dicarboxylic acid moiety containing the $$-CH=CH-\overset{\overset{O}{\|}}{C}-$$

grouping is derived from p-phenylene diacrylic acid and the remainder of the dicarboxylic acid moieties is derived from a dicarboxylic acid having the formula $$HO\overset{\overset{O}{\|}}{C}-R'-\overset{\overset{O}{\|}}{C}OH$$

wherein R' is selected from the group consisting of alkylene radicals having 2 to 12 carbon atoms and phenylene radicals.

7. The process of claim 1 wherein the dihydric alcohol moiety is derived from an alcohol selected from the group consisting of 1,4-butanediol, 1,5-pentanediol, 1,6-hexanediol, 1,9-nonanediol, diethylene glycol, 1,4-di-β-hydroxyethoxycyclohexane, neopentylglycol, and 1,4-cyclohexanedimethanol.

8. A photothermographic process which comprises imagewise exposing to actinic radiation a layer of a light-sensitive polyester composition on a photographic support and raising the tackifying temperature of exposed areas, heating the said exposed layer to selectively render unexposed areas tacky, and thereafter transferring the said tackified unexposed areas to a second support; said light-sensitive polyester composition comprising a photocrosslinkable polyester and having a tackifying temperature of about 50° C. to 200° C., a glass transition temperature of less than about 30° C., and a crystallinity of about 10 to 80 percent as determined by X-ray diffraction, said polyester containing as recurring units:

a. 50 mole percent of at least one dihydric alcohol moiety derived from an alcohol having the formula HO-R-OH wherein R is a divalent organic radical having 2 to 12 carbon atoms selected from the group consisting of hydrocarbon radicals, -alkylene-O-alkylene- radicals and -alkylene-O-cyclohexane-O-alkylene- radicals, and
b. 50 mole percent of at least two dicarboxylic acid moieties esterified with said dihydric alcohol moiety, about 5 to 45 mole percent of said dicarboxylic acid moieties being derived from a dicarboxylic acid selected from the group consisting of p-phenylene diacrylic acid and fumaric acid, and the remainder of said dicarboxylic acid moieties being derived from a dicarboxylic acid having the formula $$HO\overset{\overset{O}{\|}}{C}-R'-\overset{\overset{O}{\|}}{C}OH$$

wherein R' is a divalent hydrocarbon radical having 2 to 12 carbon atoms.

9. A photographic element comprising a support having coated thereon a layer of a light-sensitive polyester composition comprising a photocrosslinkable polyester and having a tackifying temperature of about 50° C. to 200° C., a glass transition temperature of less than about 30° C., and a crystallinity of about 10 to 80 percent as determined by X-ray diffraction, said polyester containing as recurring units:

a. 50 mole percent of at least one dihydric alcohol moiety, and
b. 50 mole percent of at least two dicarboxylic acid moieties esterified with said dihydric alcohol moiety, about 5 to 45 mole percent of said dicarboxylic acid moieties containing as an integral portion a $$-CH=CH-\overset{\overset{O}{\|}}{C}-$$

grouping.

10. A photographic element as described in claim 9 wherein the support is a transparent film.

11. A photographic element as described in claim 9 wherein the light-sensitive composition contains a colorant.

12. A photographic element as described in claim 9 wherein the light-sensitive composition is sensitized with a thiapyrylium salt.

13. A photographic element as described in claim 9 wherein the dihydric alcohol moiety is derived from an alcohol having the formula HO-R-OH wherein R is a divalent organic radical having 2 to 12 carbon atoms selected from the group consisting of hydrocarbon radicals, -alkylene-O-alkylene- radicals and -alkylene-O-cyclohexane-O-alkylene- radicals.

14. A photographic element as described in claim 9 wherein the dihydric alcohol moiety is derived from an alcohol having the formula HO-R-OH wherein R is an alkylene radical having 2 to 12 carbon atoms, the dicarboxylic acid moiety containing the $$-\text{CH}=\text{CH}-\overset{\text{O}}{\overset{\|}{\text{C}}}-$$

grouping is derived from p-phenylene diacrylic acid and the remainder of the dicarboxylic acid moieties is derived from a dicarboxylic acid having the formula $$\text{HO}\overset{\text{O}}{\overset{\|}{\text{C}}}-\text{R}'-\overset{\text{O}}{\overset{\|}{\text{C}}}\text{OH}$$

wherein R′ is selected from the group consisting of alkylene radicals having 2 to 12 carbon atoms and phenylene radicals.

15. A photographic element as described in claim 9 wherein the dihydric alcohol moiety is derived from an alcohol selected from the group consisting of 1,4-butanediol, 1,5-pentanediol, 1,6-hexanediol, 1,9-nonanediol, diethylene glycol, 1,4di-β-hydroxyethoxycyclohexane, neopentylglycol, and 1,4-cyclohexanedimethanol.

16. A photographic element comprising a support having coated thereon a layer of a light-sensitive polyester composition comprising a photocrosslinkable polyester and having a tackifying temperature of about 50° C. to 200° C., a glass transition temperature of less than about 30° C., and a crystallinity of about 10 to 80 percent as determined by X-ray diffraction, said polyester containing as recurring units:

a. 50 mole percent of at least one dihydric alcohol moiety derived from an alcohol having the formula HO-R-OH wherein R is a divalent organic radical having 2 to 12 carbon atoms selected from the group consisting of hydrocarbon radicals, -alkylene-O-alkylene- radicals and -alkylene-O-cyclohexane-O-alkylene- radicals, and b. 50 mole percent of at least two dicarboxylic acid moieties esterified with said dihydric alcohol moiety, about 5 to 45 mole percent of said dicarboxylic acid moieties being derived from a dicarboxylic acid selected from the group consisting of p-phenylene diacrylic acid and fumaric acid, and the remainder of said dicarboxylic acid moieties being derived from a dicarboxylic acid having the formula $$\text{HO}\overset{\text{O}}{\overset{\|}{\text{C}}}-\text{R}'-\overset{\text{O}}{\overset{\|}{\text{C}}}\text{OH}$$

wherein R′ is a divalent hydrocarbon radical having 2 to 12 carbon atoms.

17. A photothermographic process which comprises imagewise exposing to actinic radiation an opaque layer of a light-sensitive polyester composition on a transparent photographic support, and thereafter heating the said exposed layer to clarify unexposed areas while retaining exposed areas in opaque form, said light-sensitive polyester composition comprising a photocrosslinkable polyester and having a tackifying temperature of about 50° C. to 200 C., a glass transition temperature of less than about 30° C. and a crystallinity of about 10 to 80 percent as determined by X-ray diffraction, said polyester containing as recurring units:

a. 50 mole percent of at least one dihydric alcohol moiety, and b. 50 mole percent of at least two dicarboxylic acid moieties esterified with said dihydric alcohol moiety, about 5 to 45 mole percent of said dicarboxylic acid moieties containing as an integral portion a $$-\text{CH}=\text{CH}-\overset{\text{O}}{\overset{\|}{\text{C}}}-$$

grouping.

18. A process which comprises imagewise exposing to actinic radiation a transparent layer of a light-sensitive polyester composition on a transparent photographic support, and treating said exposed layer with a solvent to cause crystallization to occur in unexposed areas to render said unexposed areas opaque while retaining exposed image areas in transparent form; said light-sensitive polyester composition comprising a photocrosslinkable polyester and having a tackifying temperature of about 50° C. to 200° C., a glass transition temperature of less than about 30° C., and a crystallinity of about 10 to 80 percent as determined by X-ray diffraction, said polyester containing as recurring units:

a. 50 mole percent of at least one dihydric alcohol moiety, and b. 50 mole percent of at least two dicarboxylic acid moieties esterified with said dihydric alcohol moiety, about 5 to 45 mole percent of said dicarboxylic acid moieties containing as an integral portion a $$-\text{CH}=\text{CH}-\overset{\text{O}}{\overset{\|}{\text{C}}}-$$

grouping.

19. The process of claim 18 wherein the transparent coating is prepared by coating from a chlorinated hydrocarbon solvent.

20. The process of claim 18 wherein the solvent used to cause crystallization in the unexposed areas is methyl ethyl ketone.

* * * * *

PO-1050
(5/69)

UNITED STATES PATENT OFFICE
CERTIFICATE OF CORRECTION

Patent No. 3,622,320 Dated November 23, 1971

Inventor(s) Frank D. Allen, deceased by Mona Armstrong Allen, executrix

It is certified that error appears in the above-identified patent and that said Letters Patent are hereby corrected as shown below:

Column 9, lines 41-42, "A light sensitive matrix was prepared by coating a transparent biaxially stretched poly(ethylene black" should be deleted and the following inserted ---A toner matrix was prepared by dispersing 2.0 grams of carbon black---.

Signed and sealed this 2nd day of May 1972.

(SEAL)
Attest:

EDWARD M.FLETCHER,JR.
Attesting Officer

ROBERT GOTTSCHALK
Commissioner of Patents